United States Patent
Maruyama et al.

(10) Patent No.: US 6,191,520 B1
(45) Date of Patent: Feb. 20, 2001

(54) ELECTRO-MECHANICAL ENERGY CONVERSION ELEMENT AND VIBRATION TYPE DRIVING DEVICE

(75) Inventors: Yutaka Maruyama, Tokyo; Nobuyuki Kojima, Yokohama, both of (JP)

(73) Assignee: Canon Kabushiki Kaisha, Tokyo (JP)

( * ) Notice: Under 35 U.S.C. 154(b), the term of this patent shall be extended for 0 days.

(21) Appl. No.: 09/076,882

(22) Filed: May 13, 1998

(30) Foreign Application Priority Data

May 16, 1997 (JP) .................................................. 9-126984

(51) Int. Cl.[7] .................................................... H02N 2/00
(52) U.S. Cl. ........................ 310/323.06; 310/366
(58) Field of Search ................................ 310/365, 366, 310/323.03, 323.06

(56) References Cited

U.S. PATENT DOCUMENTS

| | | | |
|---|---|---|---|
| 4,742,264 | * 5/1988 | Ogawa | 310/332 |
| 4,759,107 | * 7/1988 | Ogawa et al. | 29/25.35 |
| 5,302,219 | * 4/1994 | Hargis | 156/89 |
| 5,594,291 | 1/1997 | Tamai et al. | 310/323 |
| 5,646,469 | 7/1997 | Tsukimoto | 310/323 |
| 5,669,127 | * 9/1997 | Takahashi et al. | 29/25.35 |
| 5,739,621 | 4/1998 | Atsuta et al. | 310/316 |
| 5,770,916 | 6/1998 | Ezaki et al. | 310/336 |
| 5,936,327 | * 8/1999 | Takahashi et al. | 310/323 |
| 6,046,526 | * 4/2000 | Maruyama | 310/323.06 |
| 6,051,911 | * 4/2000 | Kojima et al. | 310/323.06 |

FOREIGN PATENT DOCUMENTS

| | | | |
|---|---|---|---|
| 3-40767 | 2/1991 | (JP) | H02N/2/00 |
| 3-117384 | 5/1991 | (JP) | H02N/2/00 |
| 4-306888 | 10/1992 | (JP) | H01L/41/09 |

* cited by examiner

Primary Examiner—Thomas M. Dougherty
(74) Attorney, Agent, or Firm—Fitzpatrick, Cella, Harper & Scinto

(57) ABSTRACT

A stacked type electro-mechanical energy conversion element for use with a vibration driven device and a power supply includes a surface layer, a first surface electrode made of conductive material formed in the surface layer, for receiving a driving electrical signal from the power supply, and a second surface electrode formed in the surface layer that defines an index, where the second surface electrode is formed of the same material as the first surface electrode.

34 Claims, 6 Drawing Sheets

ELECTRO-MECHANICAL ENERGY CONVERSION ELEMENT AND VIBRATION TYPE DRIVING DEVICE

BACKGROUND OF THE INVENTION

1. Field of the Invention

This invention relates to an electro-mechanical energy conversion element (piezoelectric element) which is a vibration generating source and a vibration type driving device having at least a vibration member including the conversion element.

2. Related Background Art

Piezoelectric elements as electro-mechanical energy conversion elements are used for various purposes, and in recent years they have been used as vibration generating sources constituting vibration members in vibration wave driving devices, such as vibration wave motors. Such a piezoelectric element is used as the vibration generating source of a vibration member of a pencil type vibration wave motor in which the piezolectric element is sandwiched between cylindrical metal blocks and causes the flexural vibration of the metal blocks, whereby the metal blocks are moved relative to a contact member in contact with the metal blocks by the circular or elliptical motion of the surface particles of the metal blocks caused by the flexural vibration, or as the vibration generating source of a vibration member of a ring-like vibration wave motor in which the piezoelectric element is adhesively secured to one surface of a ring-like metallic resilient member and forms a travelling wave in the metallic elastic member, for example, by the combination of two standing waves and relatively moves a contact member in contact with this elastic member.

For example, the piezoelectric element may be used in a pencil type vibration wave motor, as described in Japanese Patent Application Laid-Open No. 3-40767 or Japanese Patent Application Laid-Open No. 3-117384, which is a structure including a plurality of circular piezoelectric elements. The polarizing direction of the elements in the direction of thickness alternates so that elements to the left and right or before and behind a particular element have an opposite polarizing direction. Electrode films are formed on both surfaces of each piezoelectric ceramic plate and are positionally provided with a phase difference of 90° and are superposed one upon another while being sandwiched between electrode plates.

FIG. 8 of the accompanying drawings shows the front surface of a disc-shaped piezoelectric element used as the vibrator of a pencil type vibration wave motor. This piezoelectric element is made by molding ceramic powder having a piezoelectric property using a press method or an extrusion method, and thereafter sintering it to form piezoelectric ceramics, working the piezoelectric ceramics into a circular shape having a predetermined thickness, and thereafter forming thereon an electrode film by a vapor deposition method or a printing method. The electrode film A1 and electrode film B1 on the front surface are divided by a gap GS (hereinafter referred to as the slit) of a predetermined width in the diametrical direction, and the back surface (not shown) is generally formed with electrode film.

The portions of the piezoelectric ceramics in the areas corresponding to the electrode film A1 and electrode film B1 are polarized in different polarizing directions (+) and (−).

Now, when the vibration member of such a pencil type vibration wave motor is to be assembled, it is necessary to assemble it while recognizing the orientation/direction of the element associated with the polarizing direction of the above-described piezoelectric element, and various marks for such recognition have been proposed.

As shown, for example, in FIG. 9 of the accompanying drawings, a plurality of cut-aways C are formed in the outer peripheral portion of the piezoelectric element by machining or the like to thereby provide a mark, or as described in Japanese Patent Application Laid-Open No. 4-306888, the widths a1 and a2 of slits $GS_1$ and $GS_2$ dividing the electrode film A1 and electrode film B1 on the front surface as shown in FIG. 10 of the accompanying drawings are changed to e.g. a1>a2, whereby the orientation/direction of the element associated with the polarizing direction of the piezoelectric element can be correctly recognized.

Also, recently, a stacked piezoelectric element comprising a plurality of piezoelectric elements made integral with one another and sintered has been made, and a reduction in the driving voltage of the vibration wave motor and the downsizing of such motor have been attempted.

Such a stacked piezoelectric element 1, as shown in FIG. 6 of the accompanying drawings, is made by the internal electrodes 6 of a plurality of elements 1 which are indicated by hatching being connected together by inter-layer wiring 4 formed in the interior of the elements. The reference numeral 3 designates surface via-hole electrodes formed in the surface of the stacked piezoelectric element 1.

Such inter-layer wiring 4 in the interior of the elements is called a via-hole (through-hole) electrode, and can be made by a manufacturing technique for low-temperature sintered ceramics circuit substrates.

Generally, the stacked piezoelectric element 1 can be made by forming a hole in a green sheet of piezoelectric ceramics, filling the hole with conductor paste, printing an electrode pattern as internal electrodes on the surface of the green sheet by the use of the conductive paste, and thereafter stacking a plurality of such green sheets to form a stacked-sheet member, and sintering it. As a result of the stacked piezoelectric element having been made in this manner, the internal electrodes 6 and the via-hole electrode (inter-layer wiring) 4 become integral with each other, and the wiring for connecting the layers of the element together can be formed.

The stacked piezoelectric element made in this manner, when used in a pencil type vibration wave motor, is held by and between metal blocks D1 and D2, as shown in FIG. 7 of the accompanying drawings, and at the same time, a wiring substrate E is brought into pressure contact with that surface of the stacked piezoelectric element 1 which has the surface via-hole electrodes 3 to thereby make electrical contact (conduction) possible, and the element is fastened and fixed by a bolt BLT.

An electrical conductor layer on the wiring substrate E conducts to each surface via-hole electrode 3 on the surface of the stacked piezoelectric element 1, whereby there is formed an electrically conducting pattern capable of supplying electric power to the piezoelectric element 1.

In the construction of the vibration member F as described above, the surfaces of the stacked piezoelectric element 1 must be smooth and parallel. If element 1, after sintered, has deformation or distortion caused therein, it is necessary to work the upper and lower surfaces of the element to thereby make these surfaces smooth.

Therefore, to recognize the orientation/direction of the stacked piezoelectric element 1 when the vibration member of a vibration type driving device such as a vibration wave motor using the stacked piezoelectric element 1 is assembled, it is known to form cut-aways in the outer peripheral portion of the element (as in the aforedescribed piezoelectric element, which is a single plate) or to attach additional electrode film or the like after the surface working to thereby provide a mark.

However, the formation of the cut-aways takes much time and labor and adds a post-manufacturing step which leads to an increase in cost, and it has been found that the cut-away portions adversely affect the vibration of the vibration member.

Also, after the surface working, the direction of the element cannot be accurately determined, and there arises a case where no mark can be provided.

SUMMARY OF THE INVENTION

One aspect of the invention is that positioning indexes of the same material as electrode portions are provided on the surface of an electro-mechanical energy conversion element such as a piezoelectric element, whereby the positional accuracy as the indexes can be made higher substantially without any increase in cost.

Other objects of the present invention will become apparent from the following detailed description of the invention.

DESCRIPTION OF THE PREFERRED EMBODIMENTS

[First Embodiment]

Figure 1:
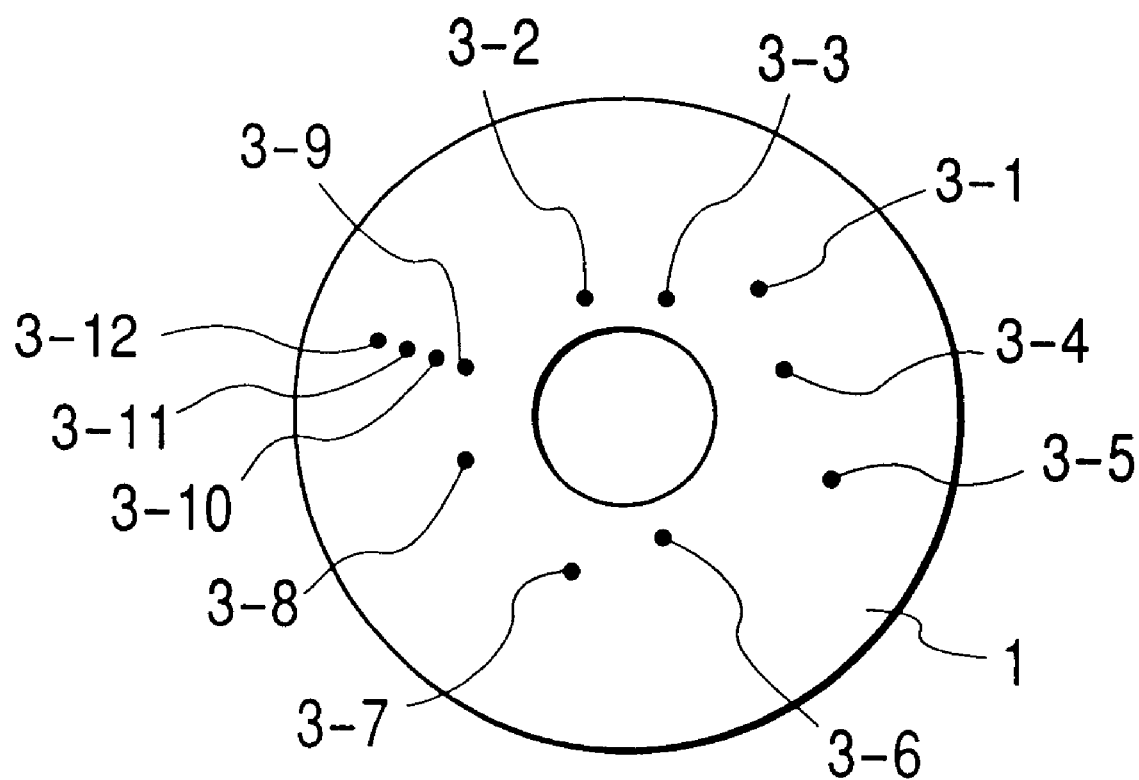
FIG. 1 is a plan view showing a first embodiment of a piezoelectric element according to the present invention.
Figure 2:
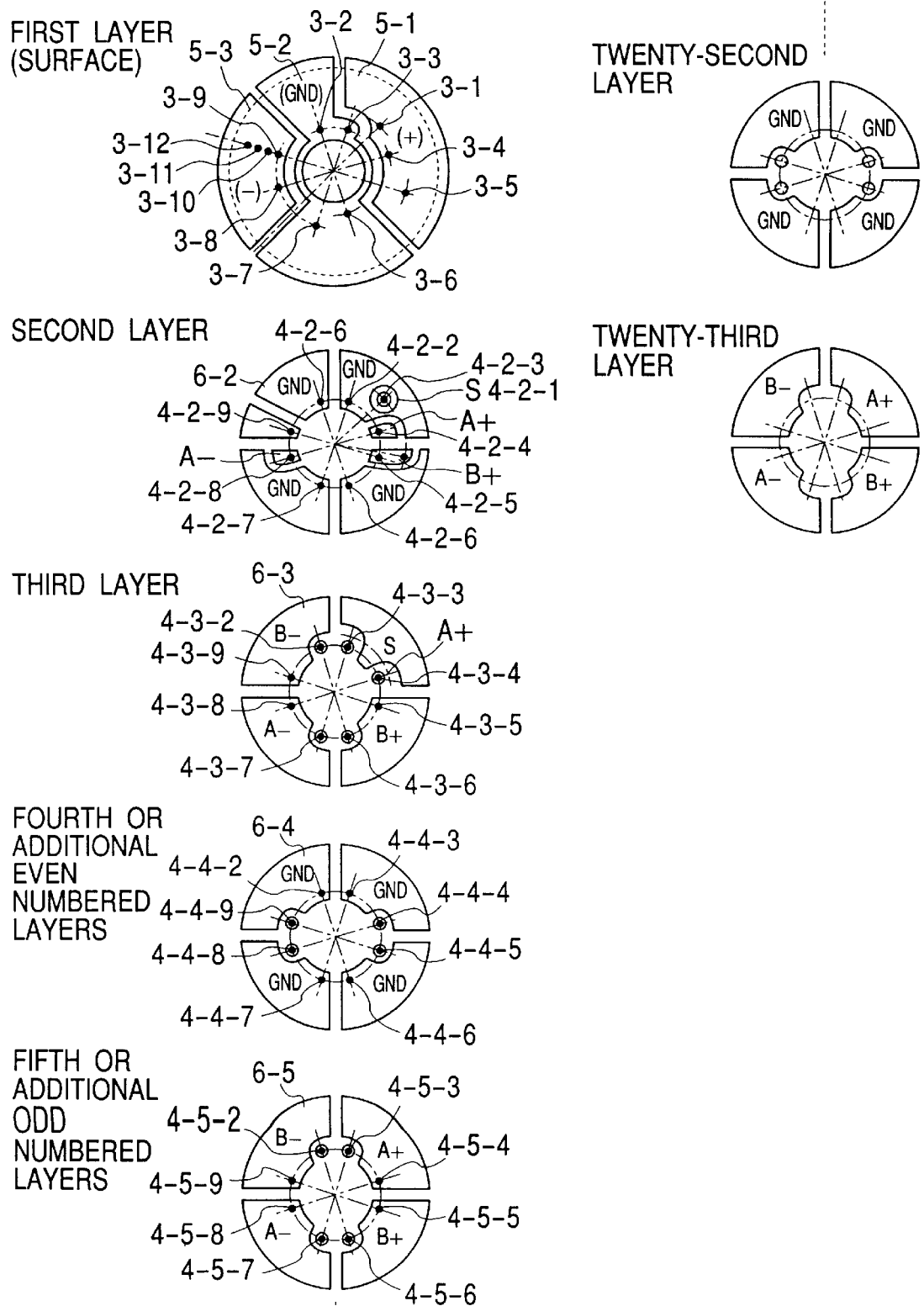
FIG. 2 shows the construction of each layer of the stacked piezoelectric element of FIG. 1.

FIGS. 1 and 2 show a first embodiment of the present invention. FIG. 1 shows the surface via-hole electrodes 3 of a stacked piezoelectric element as a stacked type electro-mechanical energy conversion element, and FIG. 2 shows surface via-hole electrodes 3 and electrode film 5 on the surface of the element of FIG. 1, as well as interior via-hole electrodes 4 and internal electrodes 6 in each layer in the interior of the stacked piezoelectric element.

In FIG. 1, the reference numerals 3-$i$ designate via-hole electrodes on the surface of the uppermost layer, and the reference numerals 3-2 to 3-9 denote surface via-hole electrodes (through-hole electrodes) supplied with electric power to actually drive a vibration wave motor. As shown in FIG. 2, the surface via-hole electrodes 3-2 to 3-9 of the uppermost layer conduct electrical signals to respective internal electrodes 6-$i$ in each layer, i.e., by internal via-hole electrodes 4-2-2 to 4-2-9 on the second layer, interior via-hole electrodes 4-3-2 to 4-3-9 on the third layer, interior via-hole electrodes 4-4-2 to 4-4-9 on the fourth layer, and so on. The surface via-hole electrode 3-1 on the uppermost layer and the interior via-hole electrode S 4-2-1 on the second layer are via-hole electrodes taking out an output of a sensor electrode S (third layer).

In this embodiment, surface via-hole electrodes 3-10 to 3-12 are indexes present only on the first layer, which is the uppermost layer, and need not be conductive. In order to indicate the orientation/direction of the stacked piezoelectric element in the circumferential direction, four surface via-hole electrodes are arranged in a straight line in the order 3-9→3-10→3-11→3-12 in the radial direction from the center of the element. By image processing using a camera or the like, as well as by visual observation, it is possible to highly accurately read and judge the orientation/direction of the piezoelectric element 1 in the circumferential direction from a straight line linking the four surface via-holes electrodes (3-9, 3-10, 3-11 and 3-12) and the center of the element.

The reason why four surface via-hole electrodes are arranged in this manner is that, although at least two surface via-hole electrodes enable the orientation/direction to be judged properly, misjudgment may occur due to the adherence of dust or the like; thus, having four in total enhances the reliability of recognition.

The dimensions of the piezoelectric element 1 are: the outer diameter is 10 mm, the inner diameter is 2.8 mm and the thickness is about 2.1 mm; and by both-surface lapping, the three-divided electrode films 5-1, 5-2 and 5-3 for polarizing on the uppermost layer (the first layer) of FIG. 2 are removed and as shown in FIG. 1, only the surface via-hole electrodes 3 (diameter of about 0.12 mm) are outwardly exposed. The thickness of each layer is about 90 $\mu$m, and the thicknesses of the electrode film 5 on the surface and on each of the internal electrodes 6-$i$ are 2 to 3 $\mu$m. The via-hole electrodes 3 and 4 are usually formed of a metal composed of silver-palladium, and have metallic luster; the surfaces of the via-hole electrodes are smoothed by surface working, and are easy to see when they are observed visually or through a camera or the like, and a device is placed so as to reflect light thereon from a light source for judging the orientation/direction of the piezoelectric element 1.

In FIG. 2, electrode films 5-1 to 5-3 having a thickness of 2 to 3 $\mu$m on the uppermost layer (the first layer) are used only during the polarizing process of the element. In the areas marked (+) and (−) of FIG. 2, +300 V and −300 V are applied to the ground GND, and when this element is used as a vibration wave motor, these electrode films are removed by surface working (the allowance for shaving is a maximum of several tens of $\mu$m), as previously described, but the surface via-hole electrodes 3 having a depth corresponding to the thickness of about 90 $\mu$m of a layer remain.

The second and subsequent layers show the internal electrodes 6-$i$ and internal via-hole electrodes 4 of the piezoelectric element 1, and the outer diameter of the internal electrodes 6-$i$ is 9.2 mm, which is smaller than the outer diameter 10 mm of the piezoelectric element 1. The diameters of the via-hole electrodes 3 and 4 are 0.12 mm. In the second and subsequent layers, S designates the sensor phase electrode, and A+− and B+− indicate + and − of each of A phase electrodes and B phase electrodes. GND is the ground of A phase and B phase. The total number of the electrode patterns of this element is twenty-three (layers), and referring to FIG. 2, the first to third layers, the twenty-second layer and the twenty-third layer differ from one another, as shown. The remaining even numbered layers are similar to the fourth layer and the remaining odd numbered layers are similar to the fifth layer.

[Second Embodiment]

Figure 3:
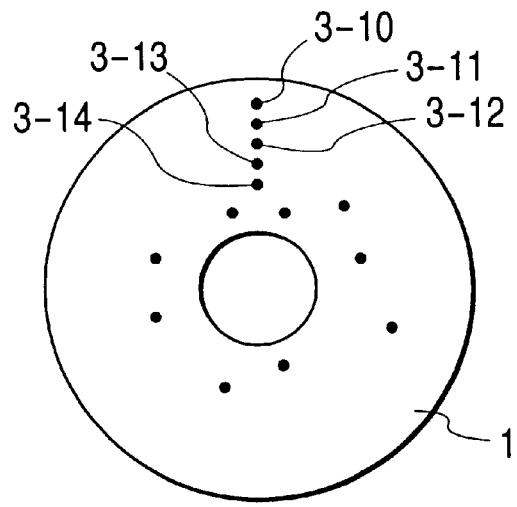
FIG. 3 is a plan view showing a second embodiment.

As shown in FIG. 3, in a stacked piezoelectric element similar to the first embodiment, surface via-hole electrodes 3-10 to 3-14 form indexes on the surface of the uppermost layer (the first layer) over a slit portion (the insulating area portion in the gap between the electrodes of the second and subsequent layers), and are arranged in a straight line so that the orientation/direction of the piezoelectric element 1 can be judged from the relative position of the indexes with respect to the center of the element.

[Third Embodiment]

Figure 4:
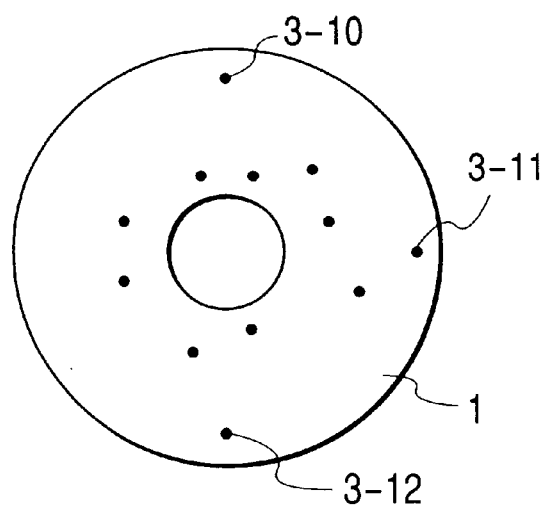
FIG. 4 is a plan view showing a third embodiment.

As shown in FIG. 4, in a stacked piezoelectric element similar to the first embodiment, surface via-hole electrodes 3-10 to 3-12 form three indexes on the uppermost layer (the first layer) that are provided near the outer periphery of piezoelectric element 1 with an angular spacing of 90° relative to the center of the piezoelectric element 1. As shown in FIG. 4, since a total of three indexes are used, the orientation/direction of the element 1 can be judged from the positional relation between the center of the element and each surface via-hole electrode 3-10, 3-11, 3-12.

[Fourth Embodiment]

Figure 5:
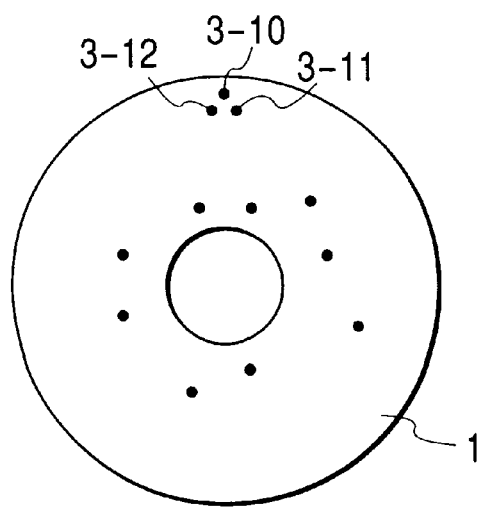
FIG. 5 is a plan view showing a fourth embodiment.
Figure 6:
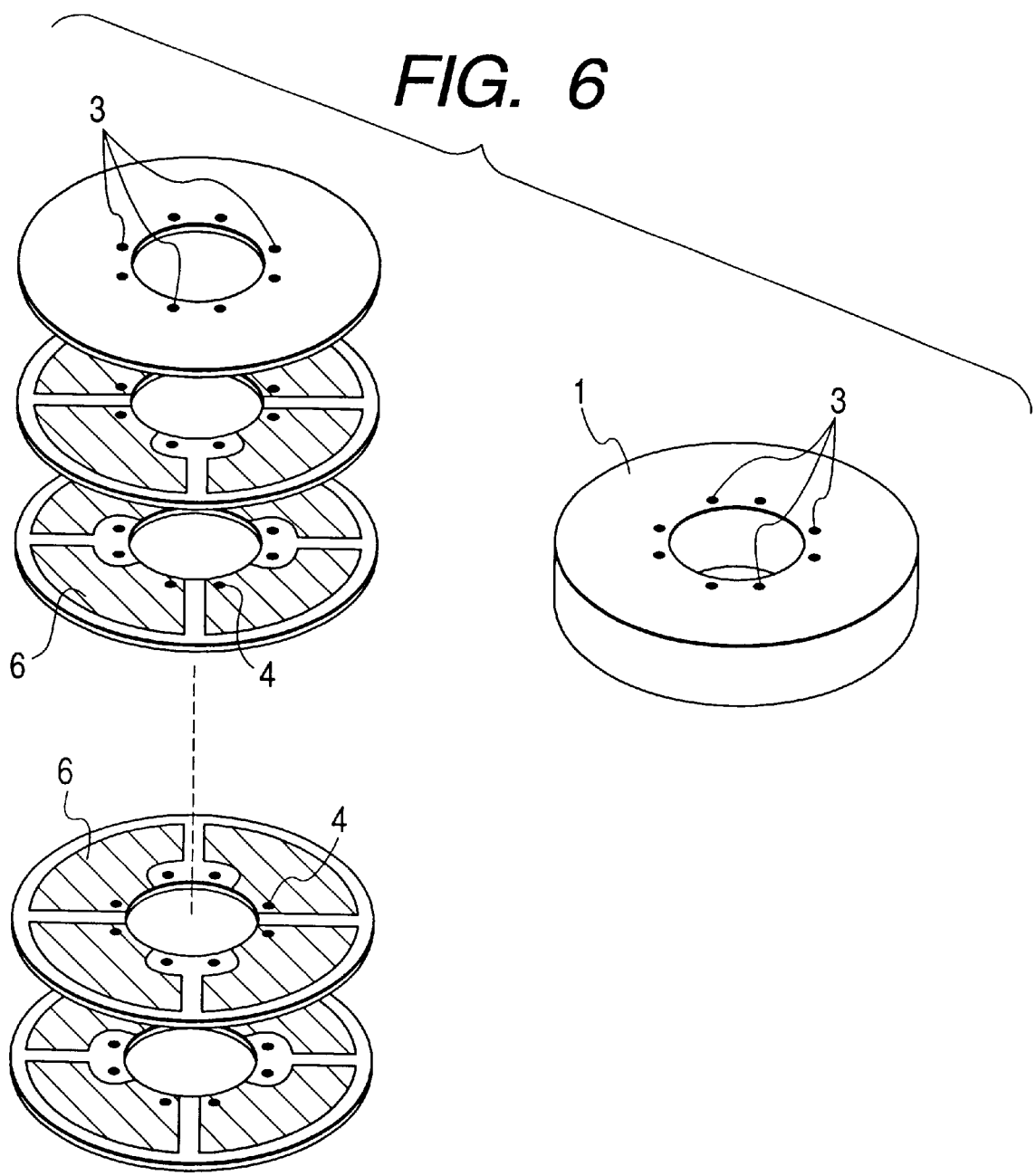
FIG. 6 is an exploded perspective view showing the construction of a stacked piezoelectric element according to the prior art.
Figure 7:
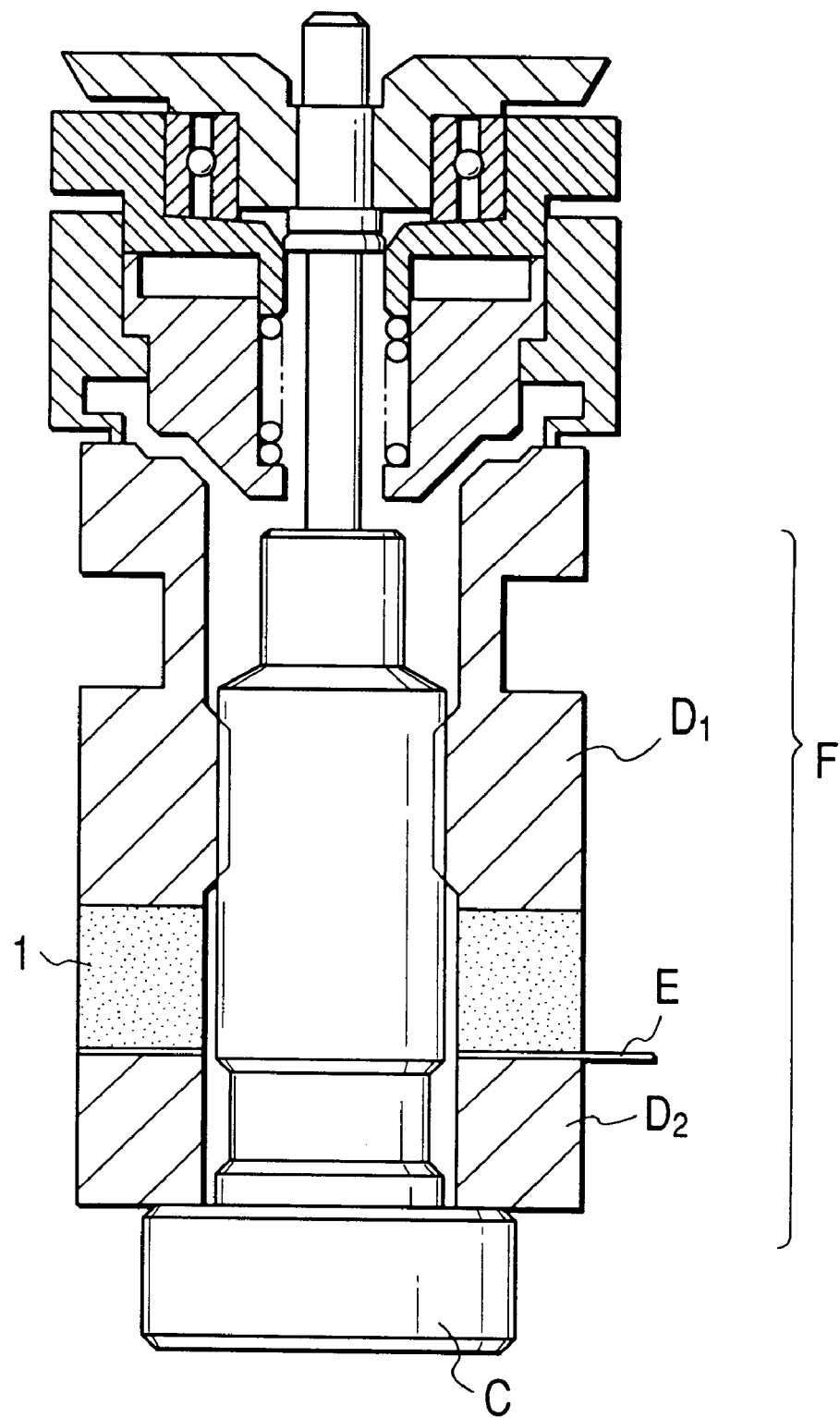
FIG. 7 is a cross-sectional view of a vibration wave motor incorporating the stacked piezoelectric element therein.
Figure 8:
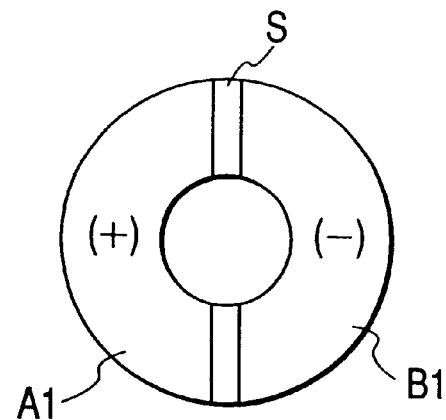
FIG. 8 is a plan view of a prior-art piezoelectric element which is a single plate.
Figure 9:
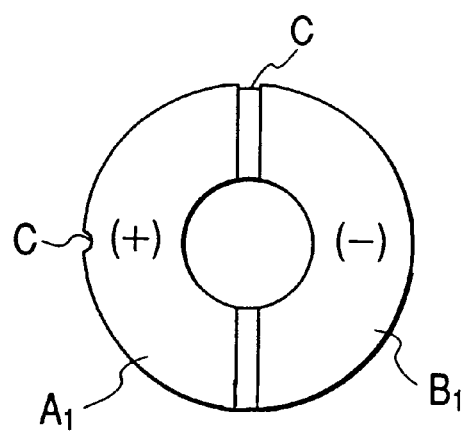
FIG. 9 is a plan view of a prior-art piezoelectric element which is a single plate.
Figure 10:
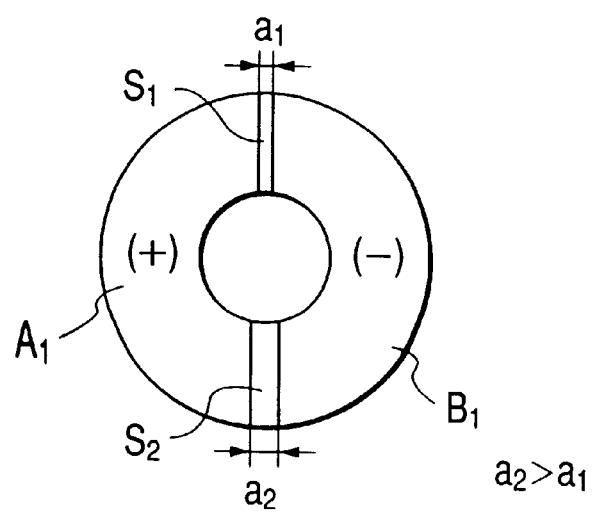
FIG. 10 is a plan view of a prior-art piezoelectric element which is a single plate.

As shown in FIG. 5, surface via-hole electrodes 3-10, 3-11 and 3-12 form indexes on the uppermost layer (the first layer) that are provided at the corners of a triangle substantially in one location (top), thereby to provide a mark.

The positions of the surface via-hole electrodes 3-10 to 3-12 (indexes providing a mark as described above) need to be determined with the wiring pattern of the wiring substrate E also taken into account so as not to affect the original polarizing direction of the stacked piezoelectric element and the supply of electric power for driving the vibration wave motor. Also, since the surface via-hole electrodes (through-hole electrodes) are point-like, they may be arranged or disposed in any manner, such as in a straight line or distributed (disposed) at the corners of a polygon, whereby during recognition a specific orientation/direction of the element may be determined. Also, in the present embodiment, the size of the surface via-hole electrodes is 0.12 mm, but a larger or smaller size will not pose a problem if the electrodes can be found on the surface of the element using a camera, visual observation, a magnifying device, or the like.

Also, the ease with which the surface via-hole electrodes can be seen has been studied for various methods of surface working, and it has been found that the working method is not particularly restricted by such considerations. However, the smoothing of the surfaces of the electrodes is desirable, as previously described. For example, after grinding or lapping, the surfaces may be rubbed with a lapping sheet or the like having very fine polishing particles so that the surfaces of the electrodes become smooth and mirror-surfaced so as to readily reflect light. Hence, reflecting surfaces can be simply provided and are easy to discriminate because the electrodes are metal.

While each of the above embodiments has been described with respect to the stacked type element for a pencil type vibration wave motor, the present invention is also suitable for a ring-like vibration wave motor.

As described above, according to the preferred embodiments, the surface via-hole electrodes are used not for conduction, but as a mark for position recognition, whereby the function and performance of the stacked piezoelectric element are not affected. The invention may be implemented using ordinary manufacturing steps, by simply increasing the number of surface via-hole electrodes. There is no need to increase the number of steps to form these new indexes. The positional accuracy of the indexes is high, and there is little or no increase in cost.

In the above-described embodiments, a piezoelectric element has been used as a stacked type electro-mechanical energy conversion element, but electrostrictive elements also may be provided with positioning indexes in a similar manner.

What is claimed is:

1. A stacked type electro-mechanical energy conversion element for use with a vibration driven device and a power supply, the energy conversion element comprising:
   a surface layer;
   at least one first surface electrode formed in said surface layer of said energy conversion element of a conductive material for receiving a driving electrical signal from the power supply; and
   at least one second surface electrode formed in said surface layer and defining an index on said surface layer of said conversion element, said at least one second surface electrode being formed of the same conductive material as said at least one first surface electrode and indicating an orientation of said energy conversion element.

2. A stacked type electro-mechanical energy conversion element according to claim 1, wherein each of said at least one second surface electrode is embedded in a hole formed in said surface layer of said energy conversion element.

3. A stacked type electro-mechanical energy conversion element according to claim 2, wherein a depth of said at least one second surface electrode is sufficient to permit an amount of the surface and said at least one second surface electrode to be shaved off said conversion element by a working operation for smoothing the surface of said conversion element, and to retain a visible portion of said at least one second surface electrode after completion of the working operation.

4. A stacked type electro-mechanical energy conversion element according to claim 2, wherein each of said at least one first surface electrode and said at least one second surface electrode is a via-hole electrode formed in said surface layer of said energy conversion element.

5. A stacked type electro-mechanical energy conversion element according to claim 1, further comprising an interior layer having an internal electrode provided on said interior layer, wherein said at least one first surface electrode is electrically connected to said internal electrode.

6. A stacked type electro-mechanical energy conversion element according to claim 4, further comprising an interior layer having an internal electrode provided on said interior layer, wherein said at least one first surface electrode is electrically connected to said internal electrode through a via-hole formed in said surface layer of said energy conversion element.

7. A stacked type electro-mechanical energy conversion element according to claim 4, further comprising a plurality of interior layers having a plurality of internal electrodes provided on said plurality of interior layers, wherein a plurality of first surface electrodes are provided in said surface layer, and wherein each of said plurality of first surface electrodes is electrically connected to a different one of said plurality of internal electrodes by a via-hole electrode formed in said surface layer of said energy conversion element.

8. A stacked type electro-mechanical energy conversion element according to claim 7, wherein each of said plurality of first surface electrodes and said plurality of second surface electrodes has a point-like shape.

9. A stacked type electro-mechanical energy conversion element according to claim 4, wherein each of said at least one first surface electrode and said at least one second surface electrode is formed of a metal comprising silver, and has a reflecting property different than a reflecting property of other areas of said surface layer.

10. A stacked type electro-mechanical energy conversion element block according to claim 1, wherein said energy conversion element is substantially cylindrically shaped and each of said at least one second surface electrode is disposed in a row in a radial direction of said energy conversion element.

11. A stacked type electro-mechanical energy conversion element according to claim 1, wherein said energy conversion element is substantially cylindrically shaped and said at least one second surface electrode is disposed at a circumference of said surface layer of said conversion element.

12. A stacked type electro-mechanical energy conversion element according to claim 11, wherein said at least one second surface electrode includes plural second surface electrodes arranged at a circumference of said surface layer, said plural second surface electrodes have a predetermined angular spacing with respect to a center of the surface layer, and two of said plural second surface electrodes have an unequal angular spacing therebetween for designating an orientation of said energy conversion element.

13. A stacked type electro-mechanical energy conversion element according to claim 1, wherein said at least one second surface electrode includes a plurality of second surface electrodes disposed collectively in a pattern at a single location on said surface layer.

14. A stacked type electro-mechanical energy conversion element according to claim 1, wherein said energy conversion element comprises a plurality of stacked piezoelectric element layers.

15. A stacked type electro-mechanical energy conversion element according to claim 2, wherein said energy conversion element comprises a plurality of stacked piezoelectric element layers.

16. A stacked type electro-mechanical energy conversion element according to claim 15, wherein each of said at least one first surface electrode and said at least one second surface electrode is a via-hole electrode formed in said surface layer.

17. A stacked type electro-mechanical energy conversion element according to claim 1, further comprising a plurality of interior layers, each of said plurality of interior layers including internal electrodes provided thereon.

18. A stacked type electro-mechanical energy conversion element according to claim 17, wherein said surface layer and said plurality of interior layers are sintered together.

19. A stacked type electro-mechanical energy conversion element according to claim 1, further comprising twenty-three interior layers, each of said interior layers having internal electrodes provided thereon.

20. A stacked type electro-mechanical energy conversion element according to claim 5, wherein said surface layer and said interior layer are sintered together.

21. A stacked-type electro-mechanical energy conversion element according to claim 6, wherein said surface layer and said interior layer are sintered together.

22. A stacked type electro-mechanical energy conversion element according to claim 19, wherein said surface layer and said interior layers are sintered together.

23. A vibration type driving device comprising:
  a vibrating member including a stacked type electro-mechanical energy conversion member for generating a vibration in said vibrating member; and
  a contact member contactable with said vibrating member and movable relative to said vibrating member by vibration generated in said vibrating member;
  a power supply electrode formed in a surface of said electro-mechanical energy conversion element; and
  a plurality of indexes provided in the surface of said electro-mechanical energy conversion element, said plurality of indexes being separate from said power supply electrode and being formed of the same material as said power supply electrode.

24. A vibration type driving device according to claim 23, wherein said plurality of indexes includes a plurality of via-hole electrodes formed in the surface of said electro-mechanical energy conversion element.

25. A vibration type driving device according to claim 24, wherein said power supply electrode and said plurality of indexes are formed using via-hole electrodes in said electro-mechanical energy conversion element.

26. A vibration type driving device according to claim 25, further comprising a plurality of internal electrodes provided on a plurality of interior layers of said stacked type electro-mechanical energy conversion element, and wherein a plurality of power supply electrodes are provided in the surface of said stacked type electro-mechanical energy conversion element and each of said plurality of power supply electrodes is electrically connected to a different one of said plurality of internal electrodes by said via-hole electrodes.

27. A vibration type driving device according to claim 26, wherein said plurality of power supply electrodes and said plurality of indexes are point-like in shape.

28. A vibration type driving device according to claim 23, wherein said stacked type electro-mechanical energy conversion element is a sintered stacked type piezoelectric element block.

29. A stacked type electro-mechanical energy conversion element for use with a vibration driven device, comprising:
  a first layer having an external surface;
  a plurality of interior layers stacked with said first layer;
  a plurality of internal electrodes formed on respective surfaces of said plurality of interior layers;
  a via-hole electrode formed in the external surface and extending through said first layer, said via-hole electrode comprising conductive material that forms an electrical connection from the external surface to at least one of said plurality of internal electrodes; and
  indexes formed in the external surface and extending at least partially through said first layer, said indexes comprising the same conductive material as said via-hole electrode and not contacting said internal electrodes.

30. A stacked type electro-mechanical energy conversion element according to claim 29, wherein said indexes are positioned on the external surface so as to indicate a direction of polarization of said the first layer and said interior layers.

31. A stacked type electro-mechanical energy conversion element according to claim 30, wherein said indexes are linearly aligned in a radial direction from a center of the external surface.

32. A stacked type electro-mechanical energy conversion element according to claim 30, wherein said are arranged at the circumference of the external surface.

33. A stacked type electro-mechanical energy conversion element according to claim 30, wherein said indexes are arranged in a geometric pattern designating an orientation of the energy conversion element.

34. A stacked type electro-mechanical energy conversion element according to claim 33, wherein the geometric pattern is provided about a single point near an edge of the external surface.

* * * * *

UNITED STATES PATENT AND TRADEMARK OFFICE
CERTIFICATE OF CORRECTION

PATENT NO. : 6,191,520 B1  
DATED : February 20, 2001  
INVENTOR(S) : Yutaka Maruyama et al.

Page 1 of 1

It is certified that error appears in the above-identified patent and that said Letters Patent is hereby corrected as shown below:

Column 7,  
Line 7, "block" should be deleted.

Column 8,  
Line 53, "said are" should read -- said indexes are --.

Signed and Sealed this

Twenty-ninth Day of January, 2002

Attest:

Attesting Officer

JAMES E. ROGAN  
*Director of the United States Patent and Trademark Office*